(12) United States Patent
Byun et al.

(10) Patent No.: US 10,161,040 B2
(45) Date of Patent: Dec. 25, 2018

(54) SHOWER HEAD FOR ELECTRONIC DEVICE HAVING DISPERSION PINS FABRICATION AND SHOWER HEAD ASSEMBLY

(71) Applicant: Korea Institute of Industrial Technology, Cheonan-si (KR)

(72) Inventors: Chul Soo Byun, Seoul (KR); Il Yong Chung, Cheonan-si (KR)

(73) Assignee: Korea Institute of Industrial Technology, Cheonan-Si, Chungcheongnam-Do (KR)

( * ) Notice: Subject to any disclaimer, the term of this patent is extended or adjusted under 35 U.S.C. 154(b) by 115 days.

(21) Appl. No.: 14/392,174

(22) PCT Filed: Jun. 25, 2014

(86) PCT No.: PCT/KR2014/005644
§ 371 (c)(1),
(2) Date: Dec. 23, 2015

(87) PCT Pub. No.: WO2014/209017
PCT Pub. Date: Dec. 31, 2014

(65) Prior Publication Data
US 2016/0184838 A1  Jun. 30, 2016

(30) Foreign Application Priority Data

Jun. 26, 2013 (KR) .................. 10-2013-0073464
Jun. 24, 2014 (KR) .................. 10-2014-0077279

(51) Int. Cl.
*B05B 1/18* (2006.01)
*C23C 16/455* (2006.01)
*H01J 37/32* (2006.01)

(52) U.S. Cl.
CPC .......... *C23C 16/45574* (2013.01); *B05B 1/18* (2013.01); *C23C 16/45565* (2013.01); *H01J 37/3244* (2013.01)

(58) Field of Classification Search
CPC ......... C23C 16/45565; C23C 16/45574; H01J 37/3244; B05B 1/18; B05B 1/005
(Continued)

(56) References Cited

U.S. PATENT DOCUMENTS

2009/0169744 A1* 7/2009 Byun ................ C23C 16/40
427/255.28
2011/0048325 A1* 3/2011 Choi ................ C23C 16/452
118/712
2012/0067971 A1* 3/2012 Byun ............... C23C 16/45565
239/106

FOREIGN PATENT DOCUMENTS

KR  10 2001 099168  11/2001
KR  10 2007 0036985   4/2007
(Continued)

*Primary Examiner* — Jason Boeckmann
(74) *Attorney, Agent, or Firm* — Reinhart Boerner Van Deuren P.C.

(57) ABSTRACT

A showerhead is provided. The showerhead includes a body and a plurality of first dispersion pins. The body has one side having a plurality of injection holes penetrated therethrough and the other side facing the one side. The plurality of first dispersion pins protruding from the plurality of spray holes of the one side to the other side such that end portions thereof support the other side. The first dispersion holes have first gas inlet holes on one side and first passages connected to the first gas inlet holes therein. Gas introduced between the one side and the other side is immediately discharged to the outside of the body through the plurality of spray holes by passing the first gas inlet holes and the first passages.

9 Claims, 4 Drawing Sheets

(58) Field of Classification Search
USPC .................................................. 239/548, 550
See application file for complete search history.

(56)     References Cited

FOREIGN PATENT DOCUMENTS

| KR | 10 2007 0112354 | 11/2007 |
| KR | 10 2009 0011978 | 2/2009 |
| KR | 10 2009 0075649 | 7/2009 |
| KR | 10 0972801 B1 | 7/2010 |
| KR | 10 0972802 B1 | 7/2010 |
| KR | 10 1064210 B1 | 9/2011 |

* cited by examiner

[Fig. 1]
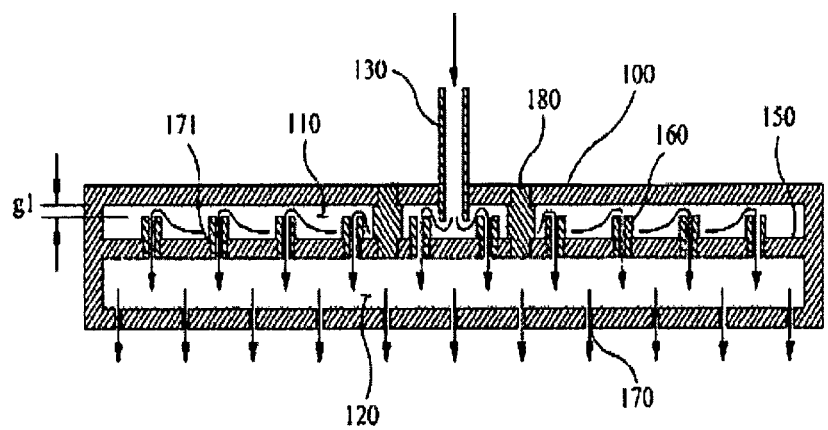
[Fig. 2]
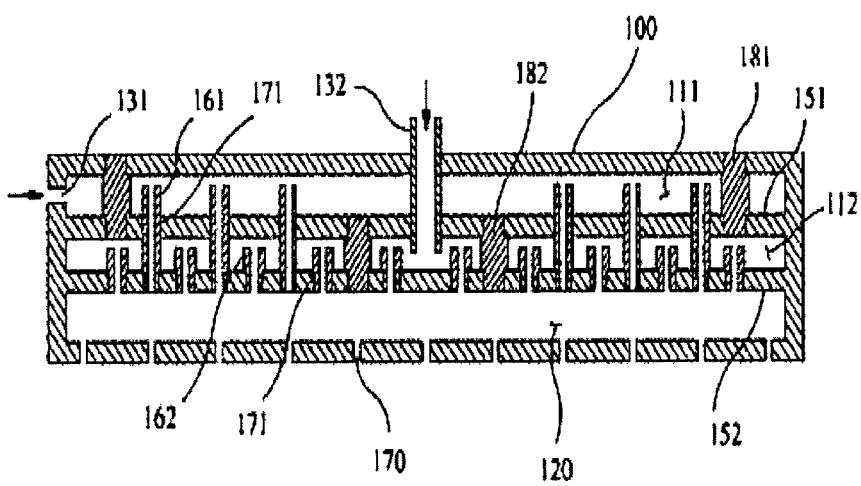

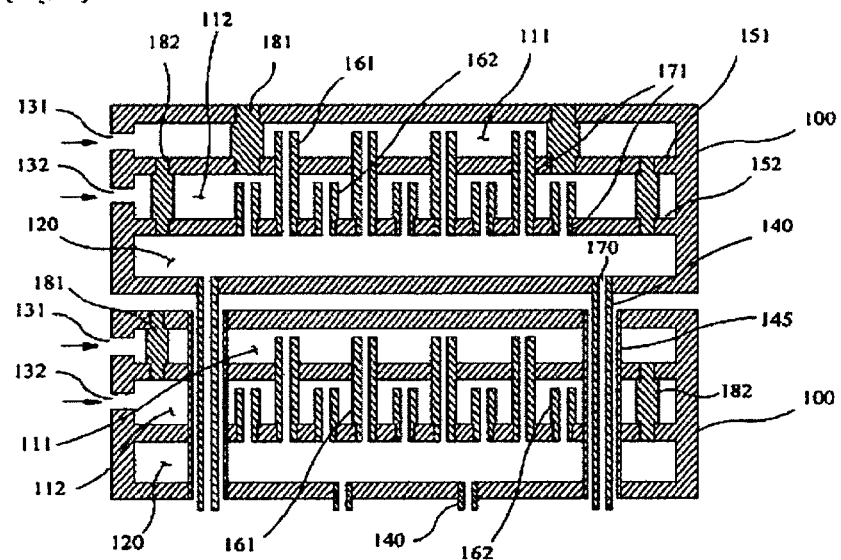
[Fig. 3]
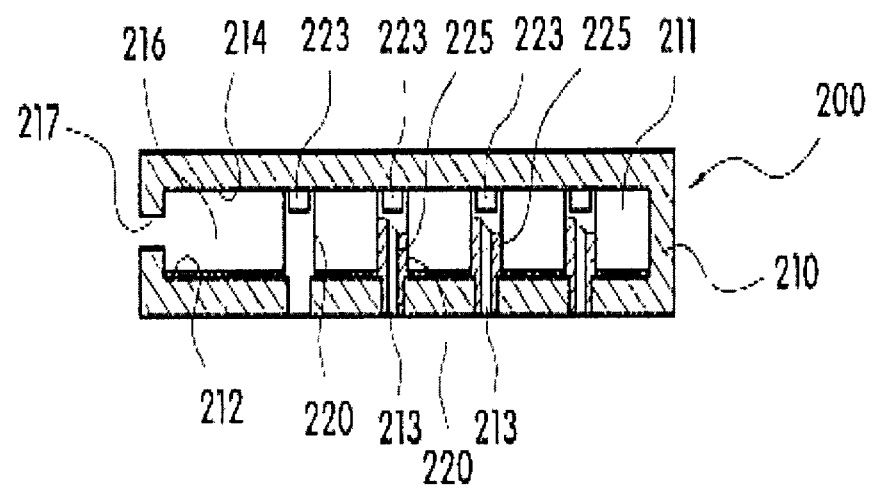
[Fig. 4]

[Fig. 5]
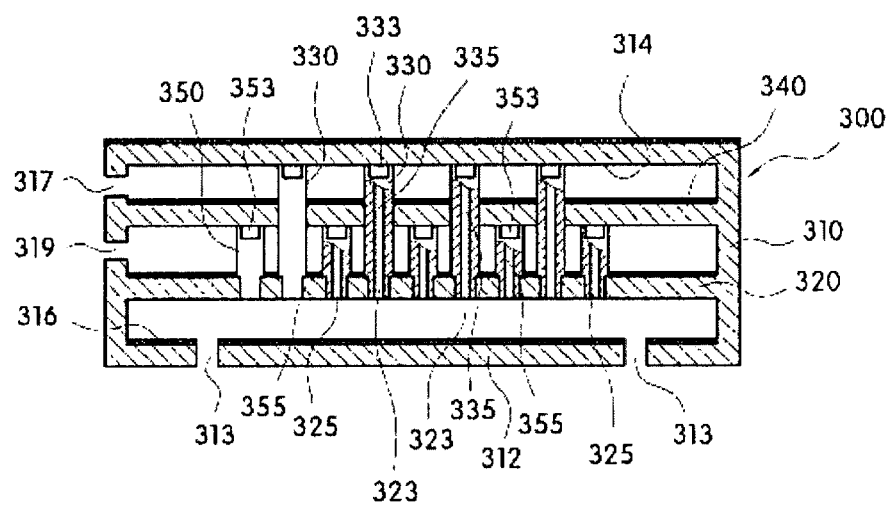
[Fig. 6]
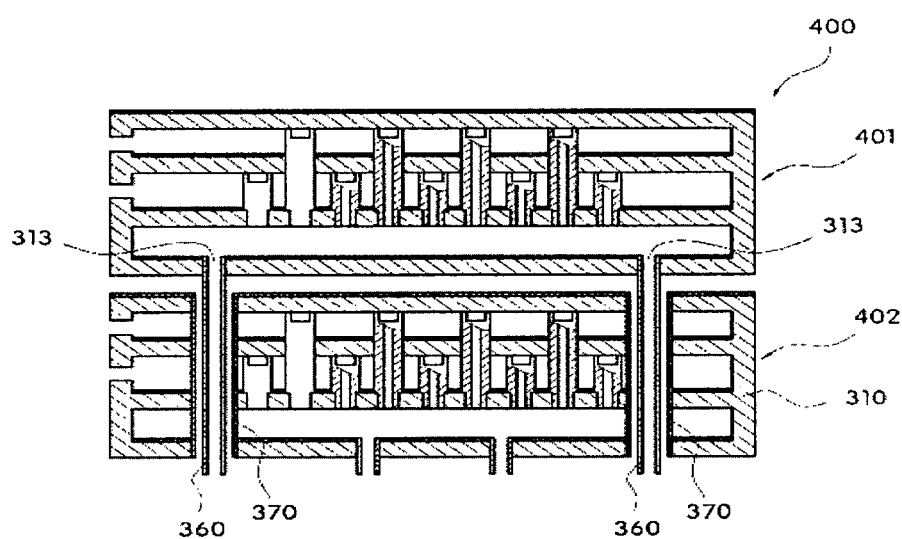

[Fig. 7]
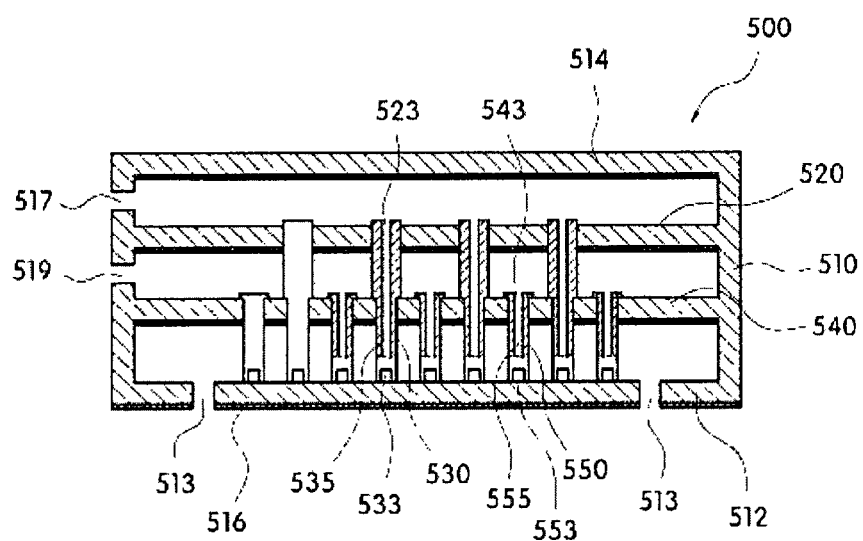
[Fig. 8]
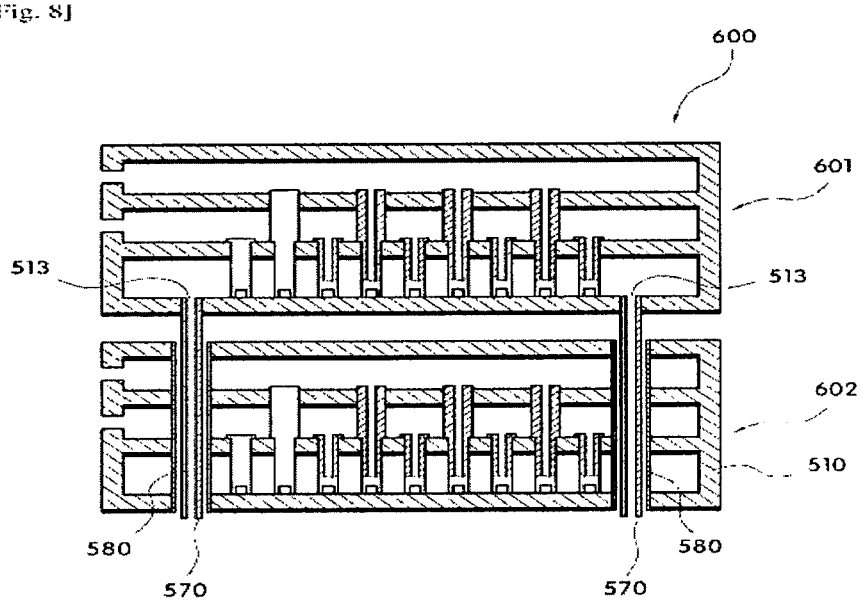

SHOWER HEAD FOR ELECTRONIC DEVICE HAVING DISPERSION PINS FABRICATION AND SHOWER HEAD ASSEMBLY

TECHNICAL FIELD

The present invention relates to a showerhead for fabrication of an electronic device and a showerhead assembly.

BACKGROUND ART

In response to increases in the sizes of substrates, such as wafers for the fabrication of semiconductor devices and glass substrates for the fabrication of flat panel displays, process uniformity across the entire area of a substrate is increasing in importance as an issue. In order to overcome this, showerheads are generally used as gas supplying means in thin-film deposition processing, etching processing, and the like.

In this case, a sufficient amount of gas must be dispersed in a lateral direction, such that the gas may be uniformly injected from the entire area of a showerhead. For this, showerhead configurations each having dispersing fins protruding upwardly from an intermediate plate within a showerhead body have been proposed in Korean Patent Nos. 10-0972801 and 10-0972802.

FIG. 1 to FIG. 3 illustrate related-art showerheads having dispersion pins, substantially identical to those disclosed by Korean Patent Nos. 10-0972801 and 10-0972802 except for reference numerals.

FIG. 1 illustrates a showerhead of the related art. As illustrated in FIG. 1, the interior space of a showerhead body 100 is divided into two spaces, i.e. a dispersion chamber 110 and a distribution chamber 120, by an intermediate plate 150 extended in a lateral direction. The intermediate plate 150 has a plurality of connecting holes 171 extended in the top-bottom direction. Dispersion pins 160 are fitted into the connecting holes 171.

The body 100 has injection holes 170 penetrated through the bottom. A gas supply part 130 is disposed within the dispersion chamber 110.

A flow of gas introduced through the gas supply part 130 toward the central portion of the dispersion chamber 110 in the longitudinal direction collides with the intermediate plate 150, and is subsequently dispersed in a lateral direction, i.e. outwardly from the central portion.

The dispersion pins 160 are intended to accelerate the lateral dispersion. It is preferable that gaps g1 between the upper faces of the dispersion pins 160 and the ceiling of the body 100 are sufficiently small compared to the length of the dispersion pins 160 protruded.

Gas supplied to the showerhead body 100 is uniformly dispersed in the lateral direction within the dispersion chamber 110 for a short period of time, influenced by the dispersion pins 160, and is subsequently uniformly introduced to the distribution chamber 120 below the dispersion chamber 110 through the dispersion pins 160. After the gas is more uniformly distributed within the distribution chamber 120, the gas having a uniform pressure is injected downwardly toward a substrate (not shown) through the injection holes 170.

However, the foregoing showerhead of the related art requires spacers 180 to be disposed within the dispersion chamber 110 in order to uniformly maintain the gap g1 and firmly fix the intermediate plate 150. This configuration increases the complexity of a fabrication process. In addition, due to the added structures, the gas may fail to be dispersed in the lateral direction rapidly and reliably.

FIG. 2 illustrates another type of showerhead of the related art. The showerhead illustrated in FIG. 2 has two intermediate plates, i.e. a first intermediate plate 151 and a second intermediate plate 152, unlike the showerhead of FIG. 1 having a single intermediate plate. The interior space of a body 100 is divided into a first dispersion chamber 111, a second dispersion chamber 112, and a distribution chamber 120 along a vertical direction. Two gas supply parts are provided, unlike the showerhead of FIG. 1 in which a single gas supply is provided. A first gas supply part 131 is disposed in the first dispersion chamber 111, and a second gas supply part 132 is disposed in the second dispersion chamber 112.

A plurality of connecting holes 171 are formed in the intermediate plates 151 and 152. A plurality of first dispersion pins 161 are fitted into portions of the connecting holes 171 in the second intermediate plate 152 such that the plurality of first dispersion pins 161 extended from the second intermediate plate extend through the second dispersion chamber 112 and through the connecting holes 171 in the first intermediate plate 151 to protrude upwardly from the first intermediate plate 151. A plurality of second dispersion pins 162 are fitted into the remaining portions of the connecting holes 171 in the second intermediate plate 152 such that the plurality of second dispersion pins 162 protrude upwardly from the second intermediate plate 152.

The first gas supplied to the first dispersion chamber 111 through the first gas supply part 131 is uniformly dispersed in a lateral direction within the first dispersion chamber 111 for a short period of time, influenced by the first dispersion pins 161, before being uniformly introduced to the distribution chamber 120 through the first dispersion pins 161. On the other hand, second gas supplied to the second dispersion chamber 112 through the second gas supply part 132 is uniformly dispersed in a lateral direction within the second dispersion chamber 112 for a short period of time, influenced by the second dispersion pins 162, before being uniformly introduced to the distribution chamber 120 through the second dispersion pins 162.

Consequently, the first gas and the second gas are uniformly mixed across the entire area within the distribution chamber 120, and the mixture gas having uniform pressure is subsequently expelled downwardly through injection holes 170.

However, like the showerhead of FIG. 1, this showerhead also requires spacers 181 and 182 to be disposed within the first dispersion chamber 111 and the second dispersion chamber 112 in order to firmly fix the intermediate plates 150, which is problematic as same.

FIG. 3 illustrates a further type of showerhead of the related art. The showerhead illustrated in FIG. 3 is configured such that two showerheads as illustrated in FIG. 2 are stacked on each other in a top-bottom direction. Injection tubes 140 extend downwardly from injection holes 170 in the upper showerhead, and the lower showerhead has guide tubes 145 through which the injection tubes 140 of the upper showerhead can extend.

With this configuration, the first gas and the second gas introduced to the upper showerhead may be uniformly distributed within a distribution chamber 120 and subsequently expelled onto a substrate (not shown) from the injection tubes 140 extending through the lower showerhead. On the other hand, the first gas and the second gas introduced to the lower showerhead may be uniformly distributed within the distribution chamber 120 and subsequently expelled downwardly through injection tubes 140 in the same manner.

Here, the first and the second gases introduced to the upper showerhead may be same as or different from the first and second gases introduced to the lower showerhead depending on intended purposes.

In this case, however, spacers 181 and 182 may be still disposed as shown in FIG. 2.

As described above, the showerheads of the related art require the spacers 180, 181, and 182 to be disposed in order to firmly fix the intermediate plates 150, 151, and 152. When gases are dispersed in a lateral direction within the dispersion chambers 110, 111, and 112, the spacers 180, 181, and 182 act as obstacles. Consequently, the gases fail to disperse rapidly and reliably, which is problematic.

DISCLOSURE

Technical Problem

An embodiment of the present invention is intended to provide a showerhead able to utilize the advantages of dispersion pins without additionally disposed spacers.

Technical Solution

According to an aspect, a showerhead includes: a body having one side in which a plurality of injection holes are formed and the other side facing the one side; and a plurality of dispersion pins respectively protruding from the plurality of injection holes in the one side toward the other side, with one end thereof supporting the other side, each of the plurality of dispersion pins having a gas inlet hole formed in one portion and a passage formed therein, the passage communicating with the gas inlet hole. Gas introduced between the one side and the other side passes through the gas inlet holes and the passages of the plurality of dispersion pins and is subsequently expelled outwardly from the body through the plurality of injection holes.

According to another aspect, a showerhead includes: a body having one side in which a plurality of injection holes are formed and the other side facing the one side; and a first intermediate plate disposed between the one side and the other side of the body, the first intermediate plate having a first connecting holes; and a first dispersion pins respectively protruding from the first connecting holes of the first intermediate plate toward the other side of the body, the one end portion of each of the first dispersion pins supporting the other side of the body, each of the first dispersion pins having a first passage formed therein, the first passage communicating with a corresponding first connecting hole among the first connecting holes. Each of the first dispersion pins has a first gas inlet hole in one portion, such that gas introduced between the other side and the first intermediate plate flows through the first gas inlet holes and through the first passages, is dispersed between the one side and the first intermediate plate, and subsequently is discharged outwardly from the body through the injection holes.

The showerhead may further include a second intermediate plate disposed between the first intermediate plate and the other side. The first dispersion pins extend through the second intermediate plate.

The first intermediate plate may have second connecting holes formed therein. The showerhead may further include a second dispersion pins protruding from the second connecting holes toward the second intermediate plate, one end portion of each of the second dispersion pins supporting the second intermediate plate, each of the second dispersion pins having a second passage formed therein, communicating with a corresponding second connecting hole among the second connecting holes. Each of the second dispersion pins has a second gas inlet hole, such that gas introduced between the first intermediate and the second intermediate plate flows through the second gas inlet holes and through the second passages, is dispersed between the one side and the first intermediate plate, and subsequently is discharged outwardly from the body through the injection holes.

The one side may be a bottom of an interior space of the body, and the other side may be a ceiling of the interior space of the body.

The first gas inlet holes may be formed in end portions of the first dispersion pins, and the second gas inlet holes may be formed in end portions of the second dispersion pins.

The showerhead may further include filler sheets to be brazed on the bottom, predetermined surfaces of the first and the second intermediate plate facing the ceiling, and upper surface of the ceiling.

According to further another aspect, a showerhead assembly includes a first and a second showerheads arranged in a top-bottom direction. Each of the first and second showerheads is the above-described showerhead. The first showerhead includes injection tubes extending downwardly from the injection holes formed in the body thereof. The second showerhead includes guide tubes through which the injection tubes of the first showerhead respectively extend in a top-bottom direction.

According to another aspect, a showerhead includes: a body having one side in which a plurality of injection holes are formed and the other side facing the one side; a third intermediate plate disposed between the one side and the other side, a third intermediate plate having third connecting holes; third dispersion pins respectively protruding from the third connecting holes of the third intermediate plate toward the one side, one end portion of each of the third dispersion pins supporting the one side of the body, each of the third dispersion pins having a third passage formed therein, communicating with a corresponding third connecting hole among the third connecting holes. Each of the third dispersion pins has a first gas outlet hole in one portion, such that gas introduced between the other side and the third intermediate plate flows through the third passages and through the first gas outlet holes and subsequently is discharged outwardly from the body through the injection holes.

The showerhead may further include a fourth intermediate plate disposed between the third intermediate plate and the one side. The third dispersion pins extend through the fourth intermediate plate.

The fourth intermediate plate may have fourth connecting holes. The showerhead may further include fourth dispersion pins protruding from the fourth connecting holes toward the one side, one end portion of each of the fourth dispersion pins supports the one side, each of the fourth dispersion pins having a fourth passage formed therein, communicating with a corresponding fourth connecting hole among the fourth connecting holes. Each of the fourth dispersion pins has a second gas outlet hole. Gas introduced between the third intermediate plate and the fourth intermediate plate flows through the fourth passages and through the fourth gas outlet holes, is dispersed between the fourth intermediate plate and the one side, and subsequently is discharged outwardly from the body through the injection holes, and the gas expelled from the first gas outlet holes is dispersed between the fourth intermediate plate and the one side and is subsequently discharged outwardly from the body through the injection holes.

The one side may be a bottom of an interior space of the body. The other side may be a ceiling of the interior space of the body.

The first gas outlet holes may be formed in end portions of the third dispersion pins. The second gas outlet holes may be formed in end portions of the fourth dispersion pins.

The showerhead may further include filler sheets to be brazed on the ceiling, predetermined surfaces of the third and the fourth intermediate plates facing the bottom, and lower surface of the bottom. Afterwards, the filler sheets may be brazed to the corresponding components by turning the showerhead upside down.

According to yet another aspect, a showerhead assembly includes third and fourth showerheads arranged in top-bottom direction. Each of the third and fourth showerheads is the above-described showerhead. The third showerhead includes injection tubes extending downwardly from the injection holes formed in the body thereof. The fourth showerhead includes guide tubes through which the injection tubes of the first showerhead respectively extend in a top-bottom direction.

Advantageous Effects

The showerhead according to the embodiment of the present invention does not require additional spacers since the dispersion pins are disposed within the showerhead to support the ceiling, the bottom, or the intermediate plate of the showerhead body.

In the showerhead according to the embodiment of the present invention, any openings formed in positions in which the dispersion pins or the injection tubes are disposed may be brazed using the filler sheet, thereby more strongly sealing the interior of the showerhead.

DESCRIPTION OF DRAWINGS

FIG. 1 is a cross-sectional view illustrating a showerhead of the related art;

FIG. 2 is a cross-sectional view illustrating another type of showerhead of the related art;

FIG. 3 is a cross-sectional view illustrating a further type of showerhead of the related art;

FIG. 4 is a cross-sectional view illustrating a showerhead according to a first embodiment of the present invention;

FIG. 5 is a cross-sectional view illustrating a showerhead according to a second embodiment of the present invention;

FIG. 6 is a cross-sectional view illustrating a showerhead assembly according to a third embodiment of the present invention;

FIG. 7 is a cross-sectional view illustrating a showerhead according to a fourth embodiment of the present invention; and FIG. 8 is a cross-sectional view illustrating a showerhead assembly according to a fifth embodiment of the present invention.

BEST MODE

Reference will now be made in detail to embodiments according to the present invention in conjunction with the accompanying drawings and described below, so that a person skilled in the art to which the present invention relates could easily practice the embodiments of the present disclosure. The embodiments of the present invention can be embodied in a variety of different forms and are by no means limited to the embodiments described hereinafter. In the following description, descriptions of components irrelevant to the present invention will be omitted for the sake of clarity.

FIG. 4 is a cross-sectional view illustrating a showerhead 200 according to a first embodiment of the present invention.

Referring to FIG. 4, the showerhead 200 according to the first embodiment of the present invention includes a body 210 and a plurality of dispersion pins 220.

The body 210 has a hexahedral shape. The body 210 has a gas inlet 217 in one portion, through which gas is introduced to the body 210, and a plurality of injection holes 213 in the bottom 212, through which the gas introduced to the body 210 is discharged. So, the gas introduced to the body 210 can be dispersed within the body 210 and can subsequently be discharged outwardly through the plurality of injection holes 213 formed in the bottom 212 of the body 210.

According to the embodiment of the present invention, the plurality of dispersion pins 220 are disposed within the body 210. When viewed in FIG. 4, each of the plurality of dispersion pins 220 protrudes upwardly through the plurality of injection holes 213, with the top end portion thereof supporting the ceiling 214.

Each of the plurality of dispersion pins 220 has defined a gas inlet hole 223 in the top end portion and a passage 225 within the same, the passage 225 communicating with the gas inlet hole 223. The passage 225 is connected to a corresponding gas hole 213 among the plurality of injection holes 213.

The gas inlet hole 223 may be formed as a cut in each end portion of the plurality of dispersion pins 220 or as a through-hole formed in a side portion of each end portion of the plurality of dispersion pins 220.

Although the configuration in which the gas inlet hole 223 is formed in each end portion of the plurality of dispersion pins 220 is illustrated in the present embodiment, the position of the gas inlet hole 223 is by no means limited thereto. The gas inlet hole 223 may be formed in each middle portion of the plurality of dispersion pins 220.

Accordingly, the showerhead 200 according to the first embodiment of the present invention is configured such that gas introduced to the body 210 through the gas inlet 217 flows through the passages 225 within the dispersion pins 220 through the gas inlet holes 223.

The gas that has flowed through the passages 225 is discharged outwardly from the body 210 through the injection holes 213. Although the plurality of dispersion pins 220 may be respectively disposed on all injection holes 213 in the body 210, the plurality of dispersion pins 220 may be respectively disposed on portions of the plurality of injection holes 213 in the body 210.

In the showerhead according to the embodiment of the present invention, the number of the dispersion pins, the size of the dispersion pins, and the sizes of the gas inlet holes, the passages, and the injection holes formed in the dispersion pins may be selected, considering the rate of dispersion of the gas introduced to the showerhead.

The showerhead according to the embodiment of the present invention is configured such that each of the plurality of dispersion pins supports the interior of the showerhead body without additional spacers being disposed within the showerhead body, since the top end portions of the plurality of dispersion pins support the ceiling while the bottom end portions are supported on the bottom. Accordingly, in the showerhead according to the embodiment of the present invention, no spacers obstruct the dispersion of gas within the body of the showerhead.

In addition, according to the embodiment of the present invention, a filler sheet 216 having through-holes in positions corresponding to the injection holes is disposed on the upper surface of the bottom of the showerhead body. The filler sheet 216 is brazed at a suitable temperature and in a suitable pressure in order to seal openings that may be present between the dispersion pins and the injection holes in the upper surface of the bottom of the showerhead body.

FIG. 5 is a cross-sectional view illustrating a showerhead according to a second embodiment of the present invention. Reference will now be made to the showerhead according to the second embodiment of the present invention in conjunction with FIG. 5, in which only some features distinguishable from those of the first embodiment will be described and descriptions of some features identical to those of the first embodiment will be omitted.

The showerhead 300 according to the second embodiment of the present invention includes a body 310, a first intermediate plate 320, a second intermediate plate 340, a plurality of first dispersion pins 330, and a plurality of second dispersion pins 350.

The showerhead 300 according to the second embodiment of the present invention includes a body 310 having a rectangular parallelepiped shape as described in the first embodiment. The showerhead body 310 has a gas inlet in one portion, through which gas is introduced to the showerhead, and a plurality of injection holes 313 formed in the bottom 312, through which the gas introduced to the body is discharged. The first intermediate plate 320 and the second intermediate plate 340 are disposed within the body 310.

In addition, the showerhead 300 according to the second embodiment of the present invention includes the plurality of first dispersion pins 330 disposed between the first intermediate plate 320 and the ceiling 314 and the plurality of second dispersion pins 350 disposed between the first intermediate plate 320 and the second intermediate plate 340.

More specifically, referring to FIG. 5, the first intermediate plate 320 and the second intermediate plate 340 are disposed in parallel to each other between the bottom 312 and the ceiling 314 of the body 310.

A first gas inlet 319 is formed in a side portion of the body 310 such that first gas can be introduced to the space between the first intermediate plate 320 and the second intermediate plate 340 through the first gas inlet 319. A second gas inlet 317 is formed in another side portion of the body 310 such that second gas can be introduced to the space between the second intermediate plate 340 and the ceiling 314 through the second gas inlet 317.

Here, the first and second gases may be the same type of gas or different types of gases.

The plurality of first dispersion pins 330 are disposed between the first intermediate plate 320 and the ceiling 314. With this configuration, the second gas introduced to the space between the second intermediate plate 340 and the ceiling 314 can flow into a space below the first intermediate plate 320 in the introduced state and can subsequently be dispersed before being discharged through the injection holes 313 in the body 310.

The bottom end portions of the plurality of first dispersion pins 330 are respectively connected to the plurality of first connecting holes 323 formed in the first intermediate plate 320, and the plurality of first dispersion pins 330 protrude upwardly such that the top end portions thereof support the ceiling 314 of the body 310.

Each of the plurality of first dispersion pins 330 has a first gas inlet hole 333 formed in the top end portion thereof and a first passage 335 formed therein, the first passage 335 communicating with the first gas inlet hole 333, such that the second gas introduced through the first gas inlet hole 333 can flow through the first passage 335 and subsequently flow through the corresponding first connecting hole 323 into the space below the first intermediate plate 320.

The second gas flowed into the space below the first intermediate plate 320 can be dispersed within the space below the bottom 312 of the body 310 and the first intermediate plate 320 and subsequently can be discharged outwardly from the body 310 through the injection holes 313 in the bottom 312 of the body 310.

On the other hand, the plurality of second dispersion pins 350 are disposed between the first intermediate plate 320 and the second intermediate plate 340 in order to guide the first gas introduced between the first intermediate plate 320 and the second intermediate plate 340 into the space below the first intermediate plate 320.

The plurality of second dispersion pins 350 are configured such that each bottom end portion thereof is connected to a corresponding second connecting hole 325 among a plurality of second connecting holes 325 formed in the first intermediate plate 320. The plurality of second dispersion pins 350 protrude upwardly such that the top end portions thereof support the underside surface of the second intermediate plate 340.

The plurality of first dispersion pins 330 disposed in the first intermediate plate 320 extend through the second intermediate plate 340.

Each of the plurality of second dispersion pins 350 has defined a second gas inlet hole 353 in the top end portion thereof and a second passage 355 therein, the second passage 355 communicating with the second gas inlet hole 353, such that the first gas introduced through the second gas inlet hole 353 can flow through the second passage 355 and subsequently flow through the corresponding second connecting hole 325 into the space below the first intermediate plate 320.

The first gas that has flowed into the space below the first intermediate plate 320 can be dispersed within the space below the bottom 312 of the body 310 and the first intermediate plate 320 and can subsequently be discharged outwardly from the body 310 through the injection holes 313 in the bottom 312 of the body 310.

Accordingly, the first gas and the second gas supplied to the space between the first intermediate plate 320 and the bottom 312 of the body 310 can uniformly mix in the space between the first intermediate plate 320 and the bottom 312 of the body 310 and can subsequently be discharged outwardly from the body through the injection holes 313.

According to the second embodiment of the present invention, the distance between the first intermediate plate and the second intermediate plate disposed within the body, the distance between the first intermediate plate and the bottom, the distance between the second intermediate plate and the ceiling, and the like may vary depending on the type of gases introduced, the flow rate of gases introduced, and the like.

The showerhead 300 according to the second embodiment of the present invention employs the plurality of first dispersion pins 330 and the plurality of second dispersion pins 350 in order to support the first intermediate plate 320 and the second intermediate plate 340 disposed within the body 310, in which the bottom end portions of the plurality of first dispersion pins 330 and the plurality of second dispersion pins 350 are coupled to the first intermediate plate 320, the top end portions of the plurality of first dispersion pins 330 support the ceiling 314, and the plurality of second dispersion pins 350 support the second intermediate plate 340, such that the first intermediate plate 320 and the second intermediate plate 340 can be firmly supported within the body 310 without spacers. Accordingly, the showerhead according to the second embodiment of the present invention prevents the dispersion of the gases from being obstructed by the spacers.

In addition, in the showerhead 300 according to the second embodiment of the present invention, filler sheets 316 similar to the filler sheet described in the first embodiment are disposed on the upper surface of the bottom 312, the upper surfaces of the first intermediate plate 320 and the second intermediate plate 340, and the outer surface of the body facing the ceiling 314. The filler sheets 316 can seal openings, for example, between the dispersion pins and the intermediate plates on which the dispersion pins are disposed.

FIG. 6 is a cross-sectional view illustrating a showerhead assembly 400 according to a third embodiment of the present invention.

Reference will now be made to the showerhead assembly 400 according to the third embodiment of the present invention in conjunction with FIG. 6, in which only some features distinguishable from those of the former embodiments will be described and descriptions of some features identical to those of the former embodiments will be omitted.

As illustrated in FIG. 6, the configuration of the showerhead assembly 400 according to the third embodiment of the present invention corresponds to a top-bottom arrangement of two showerheads 300 according to the second embodiment.

In the following description, the upper one of the two showerheads will be referred to as the upper showerhead 401, and the lower one of the two showerheads will be referred to as the lower showerhead 402.

In the showerhead assembly 400 according to the third embodiment of the present invention, each of the upper showerhead 401 and the lower showerhead 402 may be implemented as a showerhead configuration the same as that of the showerhead 300 described in the second embodiment.

Here, injection tubes 360 extend downwardly from injection holes 313 in the upper showerhead 401 such that gas discharged through injection holes 313 of the upper showerhead 401 can flow through the lower showerhead 402 and can subsequently be discharged downwardly from the lower showerhead 402.

Although FIG. 6 illustrates only two injection tubes 360 for the sake of clarity, the upper showerhead 401 may include more number of injection tubes.

According to the third embodiment of the present invention, the lower showerhead 402 has a plurality of guide tubes 370 extending through top-bottom direction of a body 310 such that the injection tubes 360 connected to the upper showerhead 401 can extend through the guide tubes 370.

Thus, gas exiting the upper showerhead 401 and gas exiting the lower showerhead 402 can be expelled downwardly from the lower showerhead 402.

The gas expelled after being introduced to the upper showerhead and the gas expelled after being introduced to the lower showerhead may be the same type of gas or different types of gases. This feature may be set variously depending on the types of gases used in the fabrication of electronic devices and the relevant process.

FIG. 7 is a cross-sectional view illustrating a showerhead 500 according to a fourth embodiment of the present invention.

Referring to FIG. 7, the showerhead 500 according to the fourth embodiment of the present invention includes a body 510, a third intermediate plate 520, a fourth intermediate plate 540, a plurality of third dispersion pins 530, and a plurality of fourth dispersion pins 550.

The showerhead 500 according to the fourth embodiment of the present invention has a rectangular parallelepiped shape as described in the second embodiment. The showerhead 500 has a gas inlet in one portion, through which gas is introduced to the showerhead, and a plurality of injection holes 513 formed in the bottom 512, through which the gas introduced to the body is discharged.

The third intermediate plate 520 and the fourth intermediate plate 540 are disposed within the body 510. The plurality of third dispersion pins 530 are disposed between the third intermediate plate 520 and the bottom 512, and the plurality of fourth dispersion pins 550 are disposed between the fourth intermediate plate 540 and the bottom 512.

More specifically, referring to FIG. 7, the third intermediate plate 520 and the fourth intermediate plate 540 are disposed in parallel to each other between the bottom 512 and the ceiling 514 of the body 510.

A third gas inlet 517 is formed in a side portion of the body such that third gas can be introduced to the space between the third intermediate plate 520 and the ceiling 514 through the third gas inlet 517. A fourth gas inlet 519 is formed in another side portion of the body 510 such that fourth gas can be introduced to the space between the third intermediate plate 520 and the fourth intermediate plate 540 through the fourth gas inlet 519.

Here, the third and fourth gases may be the same type of gas or different types of gases.

The plurality of third dispersion pins 530 are disposed between the third intermediate plate 520 and the bottom 512 of the body 510 such that the third gas introduced to the space between the third intermediate plate 520 and the ceiling 514 can flow into a space below the fourth intermediate plate 540 and can subsequently be dispersed before being discharged through the injection holes 513 in the body 510.

The top end portions of the plurality of third dispersion pins 530 are respectively connected to a plurality of third connecting holes 523 formed in the third intermediate plate 520, and the plurality of third dispersion pins 530 protrude downwardly such that the bottom end portions thereof support the bottom 512 of the body 510.

With this configuration, the top end portions of the plurality of third dispersion pins 530 support the third intermediate plate 520 while the bottom end portions of the plurality of third dispersion pins 530 are disposed on the bottom 512 of the body 510.

Each of the plurality of third dispersion pins 530 has a first gas outlet hole 533 formed in the bottom end portion thereof and a third passage 535 formed therein, the third passage 535 communicating with the corresponding third connecting hole 523. With this configuration, the third gas introduced through the third connecting holes 523 can flow through the third passages 535 and can subsequently flow through the first gas outlet holes 533 into the space between the fourth intermediate plate 540 and the bottom 512 of the body 510.

The gas discharged to the space between the fourth intermediate plate 540 and the bottom 512 can be dispersed within the same space and can subsequently be discharged outwardly from the body 510 through the injection holes 513 in the bottom 512 of the body 510.

On the other hand, the plurality of fourth dispersion pins 550 are disposed between the fourth intermediate plate 540 and the bottom 512 in order to guide the fourth gas introduced between the third intermediate plate 520 and the fourth intermediate plate 540 into the space below the fourth intermediate plate 540.

The top end portions of the plurality of fourth dispersion pins 550 are respectively connected to a plurality of fourth connecting holes 543 formed in the fourth intermediate plate 540. The plurality of fourth dispersion pins 550 protrude downwardly such that the bottom end portions thereof are connected to the bottom 512 of the body 510.

With this configuration, the top end portions of the plurality of fourth dispersion pins 550 support the fourth intermediate plate 540 while the bottom end portions of the plurality of fourth dispersion pins 550 are disposed on the bottom 512 of the body 510. Here, the plurality of third dispersion pins 530 extend through the fourth intermediate plate 540.

Each of the plurality of fourth dispersion pins 550 has a second gas outlet hole 553 formed in the bottom end portion and a fourth passage 555 formed therein, the fourth passage 555 communicating with the corresponding fourth connecting hole 543, such that the fourth gas introduced through the fourth connecting hole 543 can flow through the fourth passage 555 and can subsequently flow through the second gas outlet hole 553 into the space between the fourth intermediate plate 540 and the bottom 512 of the body 510.

The gas discharged to the space between the fourth intermediate plate 540 and the bottom 512 can be dispersed within the same space and can subsequently be discharged outwardly from the body through the injection holes 513 in the bottom 512 of the body 510.

Accordingly, the third gas and the fourth gas supplied to the space between the fourth intermediate plate 540 and the bottom 512 of the body 510 can be uniformly mixed in the space between the fourth intermediate plate 540 and the body 510 and can subsequently be discharged outwardly from the body through the injection holes 513.

The showerhead 500 according to the fourth embodiment of the present invention employs the plurality of third dispersion pins 530 and the plurality of fourth dispersion pins 550 in order to support the third intermediate plate 520 and the fourth intermediate plate 540 disposed within the body 500, in which the top end portions of the plurality of third dispersion pins 530 and the plurality of fourth dispersion pins 550 support the third intermediate plate 520 and the fourth intermediate plate 540, such that the third intermediate plate 520 and the fourth intermediate plate 540 can be firmly supported within the body 510 without spacers. Accordingly, the showerhead according to the fourth embodiment of the present invention prevents the dispersion of the gasses from being obstructed by the spacers.

In addition, in the showerhead 500 according to the fourth embodiment of the present invention, filler sheets 516 similar to the filler sheet described in the first embodiment are disposed on the ceiling, the underside surfaces of the first and second intermediate plates facing the bottom of the body, and the outer surface of the body facing the bottom. The filler sheets 516 can seal openings, for example, between the dispersion pins and the intermediate plates on which the dispersion pins are disposed.

In this case, when the filler sheets are to be disposed on the ceiling, the outer surface of the body facing the bottom, the underside surfaces of the first intermediate plate and the second intermediate plates, it is possible to dispose the filler sheets thereon by turning the showerhead according to the fourth embodiment upside down.

FIG. 8 is a cross-sectional view illustrating a showerhead assembly 600 according to a fifth embodiment of the present invention.

Reference will now be made to the showerhead assembly 600 according to the fifth embodiment of the present invention in conjunction with FIG. 8, in which only some features distinguishable from those of the former embodiments will be described and descriptions of some features identical to those of the former embodiments will be omitted.

As illustrated in FIG. 8, the configuration of the showerhead assembly 600 according to the fifth embodiment of the present invention corresponds to a top-bottom arrangement of two showerheads 500 according to the fourth embodiment.

In the following description, the upper one of the two showerheads will be referred to as the upper showerhead 601, and the lower one of the two showerheads will be referred to as the lower showerhead 602.

In the showerhead assembly 600 according to the fifth embodiment of the present invention, each of the upper showerhead 601 and the lower showerhead 602 may be implemented as a showerhead configuration the same as that of the showerhead 500 described in the fourth embodiment.

Although the fifth embodiment is realized by arranging the two showerheads 500 according to the fourth embodiment in the top-bottom direction, the showerheads described in the first or second embodiment may be disposed in this manner.

Here, injection tubes 570 extend downwardly from injection holes 513 in the upper showerhead 601 such that gas discharged through injection holes 513 of the upper showerhead 601 can flow through the lower showerhead 602 and can subsequently be discharged downwardly from the lower showerhead 602.

Although FIG. 8 illustrates only two injection tubes 570 for the sake of clarity, the upper showerhead 601 may include more number of injection tubes.

According to the fifth embodiment of the present invention, the lower showerhead 602 has a plurality of guide tubes 580 extending through a body 510 such that the injection tubes 570 connected to the upper showerhead 601 can extend through the guide tubes 580.

Thus, gas exiting the upper showerhead 601 and gas exiting the lower showerhead 602 can be expelled downwardly from the lower showerhead 602. The gas expelled after being introduced to the upper showerhead 601 and the gas expelled after being introduced to the lower showerhead 602 may be the same type of gas or different types of gases. This feature may be set variously depending on the types of gases used in the fabrication of electronic devices and the relevant process.

INDUSTRIAL APPLICABILITY

The various embodiments of the present invention as set forth above employ the plurality of dispersion pins disposed within the body of the showerhead in order to support the interior of the body support the intermediate plate(s). It is therefore possible to omit spacers supporting the interior of the body, thereby facilitating the dispersion of a gas or gases.

The invention claimed is:

1. A showerhead comprising:
   a body having a bottom of an interior space of the body in which a plurality of injection holes are formed and a ceiling facing the bottom;
   a third intermediate plate disposed between the bottom and the ceiling, the third intermediate plate having third connection holes;
   a third dispersion pins protruding from the third connecting holes of the third intermediate plate toward the bottom, one end portion of each of the third dispersion pins supporting and contacting with the bottom of the body, each of the third dispersion pins having a third passage formed therein, communicating with a corresponding third connecting hole among the third connecting holes,
   wherein each of the third dispersion pins has a first gas outlet hole that is formed on its outer surface, such that gas introduced between the ceiling and the third intermediate plate flows through the third passages and the first gas outlet holes and is subsequently discharged outwardly from the body through the injection holes; and
   a fourth intermediate plate disposed between the third intermediate plate and the bottom, wherein the third dispersion pins extend through the fourth intermediate plate.

2. The showerhead according to claim 1, wherein the fourth intermediate plate has fourth connecting holes,
   the showerhead further comprising fourth dispersion pins protruding from the fourth connecting holes toward the one side, one end portion of each of the fourth dispersion pins supports the one side, each of the fourth dispersion pins having a fourth passage formed therein, communicating with a corresponding fourth connecting hole among the fourth connecting holes,
   wherein each of the fourth dispersion pins has a second gas outlet hole, wherein gas introduced between the third intermediate plate and the fourth intermediate plate flows through the fourth passages and the fourth gas outlet holes, is dispersed between the fourth intermediate plate and the one side, and is subsequently discharged outwardly from the body through the injection holes, and the gas expelled from the first gas outlet holes is dispersed between the fourth intermediate plate and the one side and is subsequently discharged outwardly from the body through the injection holes.

3. The showerhead according to claim 2, wherein the first gas outlet holes are formed in end portions of the third dispersion pins, and the second gas outlet holes are formed in end portions of the fourth dispersion pins.

4. The showerhead according to claim 1, further comprising filler sheets to be brazed on the ceiling, predetermined surfaces of the third and fourth intermediate plates facing the bottom, and lower surface of the bottom.

5. A showerheard comprising:
   a body having a bottom of an interior space of the body in which a plurality of injection holes are formed and a ceiling facing the bottom,
   a third intermediate plate disposed between the bottom and the ceiling, the third intermediate plate having third connection holes;
   a third dispersion pins protruding from the third connecting holes of the third intermediate plate toward the bottom, one end portion of each of the third dispersion pins supporting and contacting with the bottom of the body, each of the third dispersion pins having a third passage formed therein, communicating with a corresponding third connecting hole among the third connecting holes;
   wherein each of the third dispersion pins has a first gas outlet hole that is formed on its outer surface, such that gas introduced between the ceiling and the third intermediate plate flows through the third passages and the first gas outlet holes and is subsequently discharged outwardly from the body through the injection holes; and
   wherein:
   the third passage of each of the third dispersion pins is formed by a sidewall of the third dispersion pin;
   the sidewall defines the outer surface of the third dispersion pin;
   the third passage extends longitudinally; and
   the first gas outlet hole extends through the sidewall of the third dispersion pin.

6. The shower head according to claim 5, wherein the third passage extends along an axis within the sidewall and the first gas outlet hole extends through the sidewall transverse to the axis.

7. The shower head according to claim 5, wherein the sidewall of each of the third dispersion pins extends between a first end proximate the third intermediate plate and a second end, the one end portion supporting and contacting with the bottom of the body being proximate the second end, the second end being closed preventing gas from discharging from the third passage axially through the second end.

8. The shower head according to claim 7, wherein the second end is closed by the bottom of the body.

9. The shower head according to claim 7, where the first end is open permitting gas to enter the third passage axially through the first end.

* * * * *